United States Patent [19]
Fitch et al.

[11] Patent Number: 5,376,562
[45] Date of Patent: Dec. 27, 1994

[54] METHOD FOR FORMING VERTICAL TRANSISTOR STRUCTURES HAVING BIPOLAR AND MOS DEVICES

[75] Inventors: Jon T. Fitch; Carlos A. Mazuré; Keith E. Witek; James D. Hayden, all of Austin, Tex.

[73] Assignee: Motorola, Inc., Schaumburg, Ill.

[21] Appl. No.: 65,419

[22] Filed: May 24, 1993

Related U.S. Application Data

[62] Division of Ser. No. 844,037, Mar. 2, 1992, Pat. No. 5,252,849.

[51] Int. Cl.$^5$ .......................................... H01L 21/265
[52] U.S. Cl. ........................................ 437/31; 437/40; 437/59; 437/89; 437/915
[58] Field of Search .................... 437/40, 89, 59, 913, 437/915; 257/329, 378, 334, 332

[56] References Cited

U.S. PATENT DOCUMENTS

| | | | |
|---|---|---|---|
| 2,898,454 | 8/1959 | Loughlin | 257/566 |
| 4,467,518 | 8/1984 | Bansal et al. | 437/915 |
| 4,554,570 | 11/1985 | Jastrzebski et al. | 257/331 |
| 4,603,468 | 8/1986 | Lam | 437/915 |
| 4,609,407 | 9/1986 | Masao et al. | 437/915 |
| 4,651,408 | 3/1987 | MacElwee et al. | 437/913 |
| 4,656,731 | 4/1987 | Lam et al. | 437/915 |
| 4,740,826 | 4/1988 | Chatterjee | 257/334 |
| 4,849,371 | 7/1989 | Hansen et al. | 257/197 |
| 4,851,362 | 7/1989 | Suzuki | 257/586 |
| 4,902,637 | 2/1990 | Kondou et al. | 437/915 |
| 4,902,641 | 2/1990 | Koury, Jr. | 257/329 |
| 4,997,785 | 3/1991 | Pfiester | 437/915 |
| 5,096,844 | 3/1992 | Konig et al. | 257/586 |
| 5,100,817 | 3/1992 | Cederbaum et al. | 437/913 |
| 5,122,476 | 6/1992 | Fazan et al. | 437/915 |
| 5,155,058 | 10/1992 | Fujiwara et al. | 437/915 |
| 5,156,987 | 10/1992 | Sandhu et al. | 437/915 |
| 5,192,705 | 3/1993 | Itoh | 437/915 |
| 5,208,172 | 5/1993 | Fitch et al. | 437/40 |
| 5,252,849 | 10/1993 | Fitch et al. | 257/378 |

FOREIGN PATENT DOCUMENTS

| | | | |
|---|---|---|---|
| 0137450 | 6/1988 | Japan | 437/915 |
| 1-262657 | 10/1989 | Japan | 257/378 |

OTHER PUBLICATIONS

"Impact of Surrounding Gate Transistor (SGT) for Ultra-High-Density LSI's", by Hiroshi Takato et al., was published in IEEE Trans. on Electron Devices, vol. 38, No. 3, Mar. 1991, pp. 573–577.

Drangeid, "High-Speed Field Effect Structure," IBM Technical Disclosure Bulletin, Aug. 1968, vol. 11, No. 3, pp. 332–333.

Primary Examiner—George Fourson
Assistant Examiner—Long Pham
Attorney, Agent, or Firm—Keith E. Witek

[57] ABSTRACT

A transistor is formed as either a bipolar transistor (10) or an MOS transistor (11). Each transistor (10 or 11) has a substrate (12). Bipolar transistor (10) has a first current electrode (26) underlying a control electrode (28), and a second current electrode (32) overlying the control electrode (28). MOS transistor (11) has a first current electrode (54) underlying a channel region (56), and a source lightly doped region (58) and a source heavily doped region (60) overlying the channel region (56). A control electrode conductive layer (40) is laterally adjacent a sidewall dielectric layer (48), and sidewall dielectric layer (48) is laterally adjacent channel region (56). Conductive layer (40) functions as a gate electrode for transistor (11). Each of the transistors (10 and 11) is vertically integrated such as in a vertically integrated BiMOS circuit. Transistors (10 and 11) can be electrically isolated by isolation (64 and 66).

29 Claims, 9 Drawing Sheets

METHOD FOR FORMING VERTICAL TRANSISTOR STRUCTURES HAVING BIPOLAR AND MOS DEVICES

This is a divisional of application Ser. No. 07/844,037, filed Mar. 2, 1992, now U.S. Pat. No. 5,252,849.

CROSS REFERENCE TO RELATED APPLICATIONS

Related subject matter may be found in the following copending cases filed of even date herewith:
(1) U.S. patent application Ser. No. 07/844,088 entitled "A Transistor and Method of Formation and Logic Gates Formed Therefrom" by Fitch et al.; and
(2) U.S. patent application Ser. No. 07/844,038 entitled "A Raised Vertical Transistor and Method of Formation" by Fitch et al.

FIELD OF THE INVENTION

The present invention relates generally to semiconductor technology, and more particularly, semiconductor transistors useful for vertical integration.

BACKGROUND OF THE INVENTION

Planar transistors are often used to fabricate integrated circuits. A planar MOS (metal oxide semiconductor) transistor has a diffused source electrode and drain electrode separated by a channel region. Overlying the channel region is a gate electrode that is separated from the channel region by a gate oxide. A planar bipolar transistor has a base electrode, a collector electrode, and an emitter electrode formed usually by diffusion technology. Planar transistors, although used and useful in many integrated circuit applications, are substrate area intensive and consume a large amount of substrate area per transistor. In addition, with integrated circuit geometries decreasing into sub-micron ranges, planar transistors have various disadvantages. At smaller geometries and thinner oxide thicknesses, well documented problems such as hot carrier injection, leakage currents, isolation, short channel behavior, diffusion junction depths, and channel length variations are major problems in planar transistors.

To overcome some of the disadvantages described above for planar transistors, elevated source and drain MOS transistors, lightly doped drain (LDD) MOS transistors, single polysilicon and double polysilicon planar bipolar transistors and other improvements were developed. Although the improvements reduced some of the disadvantages listed above, the improvements had some undesirable characteristics. The primary undesirable characteristic is the fact that the improved transistors were, in most cases, as area intensive or more area intensive than the planar transistor and in many cases are complex to manufacture.

Various approaches have been used to try to reduce transistor surface area and increase transistor packing density while at the same time reducing some of the adverse effects described above. The surrounding gate MOS transistor (SGT) was developed wherein a spacer gate and planar diffusions are used to form a vertical transistor. The SGT reduced some of the disadvantages that affect planar MOS transistors and reduced surface area due to a vertically positioned spacer gate. Topography problems and the geometry of the SGT usually result in source and drain contacts that are difficult to achieve and are difficult to consistently produce using sub-micron technology. In addition, doping of source regions, drain regions, and channel regions via implants can be difficult due to geometry and may require special processing.

In order to further increase circuit density, the thin film transistor (TFT) has been developed, especially for memory applications. Although small memory cell areas can result via the use of TFTs, TFTs are highly resistive and therefore not adequate for all applications.

SUMMARY OF THE INVENTION

The previously mentioned disadvantages are overcome and other advantages achieved with the present invention. The present invention comprises a transistor useful for further vertical integration and a method of forming the transistor. In one form, the transistor has a base layer wherein the base layer has a surface. A first dielectric layer is formed overlying the base layer, and a control electrode conductive layer is formed overlying the first dielectric layer. A second dielectric layer is formed overlying the control electrode conductive layer. Portions of each of the first dielectric layer, the control electrode conductive layer, and the second dielectric layer are removed to form a device opening which exposes the base layer and forms a sidewall of the control electrode conductive layer. A sidewall dielectric layer is formed laterally adjacent the sidewall of the control electrode conductive layer. A first current electrode of a first conductivity type is formed within the device opening, laterally adjacent the first dielectric layer, and overlying the base layer. A control electrode of a second conductivity type is formed within the device opening. The control electrode is laterally adjacent a bottom portion of the sidewall dielectric layer, and overlying the first current electrode. The sidewall dielectric layer is removed and the control electrode conductive layer is connected to the control electrode. A second current electrode of a first conductivity type is formed within the device opening and overlies the control electrode conductive layer.

In another form, a method is taught for using the transistor of the present invention to form stacked structures with two transistors. The stacked structures have a first transistor formed with a first current electrode that underlies a second current electrode thereof. A second transistor is formed overlying the first transistor. The second transistor has a first current electrode that underlies a second current electrode thereof.

The present invention will be more clearly understood from the detailed description below in conjunction with the accompanying drawings.

DESCRIPTION OF THE PREFERRED EMBODIMENT

Figure 1:
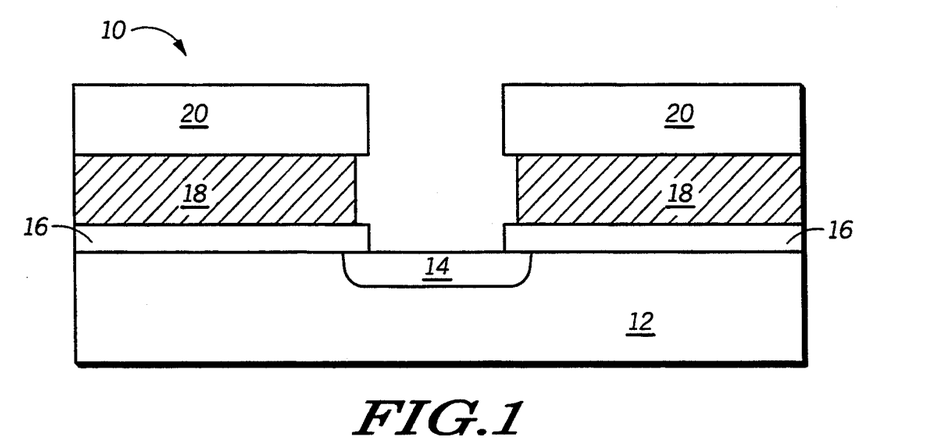
FIGS. 1-5 illustrate, in cross-sectional form, a bipolar transistor and method of formation in accordance with the present invention.

Illustrated in FIG. 1 is a structure suitable for formation of a bipolar transistor 10. The transistor 10 has a base layer or substrate 12 having a surface and having a first conductivity type. If the transistor 10 is formed overlying another device or structure, the base layer is a conductive region, electrode, or conductive layer of the underlying device or structure. Substrate 12 or the base layer may be made of silicon, gallium arsenide, silicon on sapphire, epitaxial formations, germanium, germanium silicon, and/or like substrate materials. If substrate 12 is used as the base layer, the substrate 12 is preferably made of silicon. A diffusion 14 is formed within the substrate 12. Two methods used to form diffusion 14 are discussed below. A first dielectric layer 16 is formed overlying substrate 12 and initially overlying the diffusion 14. A control electrode conductive layer 18 is formed overlying the dielectric layer 16. In a preferred form, conductive layer 18 is polysilicon, but conductive layer 18 may be a metal, a salicide or silicide, germanium silicon, or the like. A second dielectric layer 20 is formed overlying the conductive layer 18.

The dielectric layers 16 and 20, and all other dielectrics described herein may vary in physical and chemical composition based upon the function they perform. The dielectric layers described herein may be wet or dry silicon dioxide ($SiO_2$), nitride, tetra-ethyl-ortho-silicate (TEOS) based oxides, boro-phosphate-silicate-glass (BPSG), phosphate-silicate-glass (PSG), boro-silicate-glass (BSG), oxide-nitride-oxide (ONO), tantalum pentoxide ($Ta_2O_5$), plasma enhanced silicon nitride (P—$SiN_x$) and/or the like. If doped glasses, such as BPSG and PSG, are formed adjacent active areas, such as current electrodes, channel regions, and control electrodes, the doped glass can be used as a dopant source. If a doped glass dopant source is undesirable, BPSG or PSG should be shielded by an undoped glass or should not formed adjacent active areas. Specific dielectrics are noted herein if a specific dielectric is preferred or required.

A masking layer of photoresist is deposited overlying the dielectric layer 20. The masking layer is conventionally patterned and etched to form a mask opening that exposes a portion of the dielectric layer 20. A portion of the dielectric layer 20 is etched selective to the conductive layer 18 to form an opening in the dielectric layer 20. A portion of the conductive layer 18 is etched selective to the dielectric layer 16 to deepen the opening by etching into the conductive layer 18. A portion of the dielectric layer 16 is etched selective to substrate 12 to further deepen the opening by etching into the dielectric layer 16. The etching of the dielectric layer 16 exposes the surface of substrate 12. The etching of the dielectric layers 16 and 20 and control electrode conductive layer 18 results in an opening that is self-aligned to the mask opening. The opening is referred to as a device opening in some cases. It should be apparent that non-selective etches and other multiple etch processing steps are feasible for the formation of the device opening.

During the formation of the device opening, an over-etch step is used to recess the sidewalls of the control electrode conductive layer. This recession has advantages that are described herein.

The diffusion 14 is formed in one of at least two ways. In one form, the diffusion 14 can be implanted or diffused into the substrate selectively through the use of one of a photoresist mask, an oxide mask, a nitride mask or the like. Diffusion 14, in a similar manner, can be implanted through an oxide or like material to ensure a shallow, dopant-dispersed junction. This implantation or diffusion occurs before the formation of the conductive layer 18. In a second method, the diffusion 14 can be implanted or diffused after the formation of the device opening. The second method, when using implantation, is preferred due to the fact that the resulting diffusion 14 is self-aligned to the device opening. The opening can be of any geometry or size but is preferably a contact of minimum lithographic size.

Figure 2:
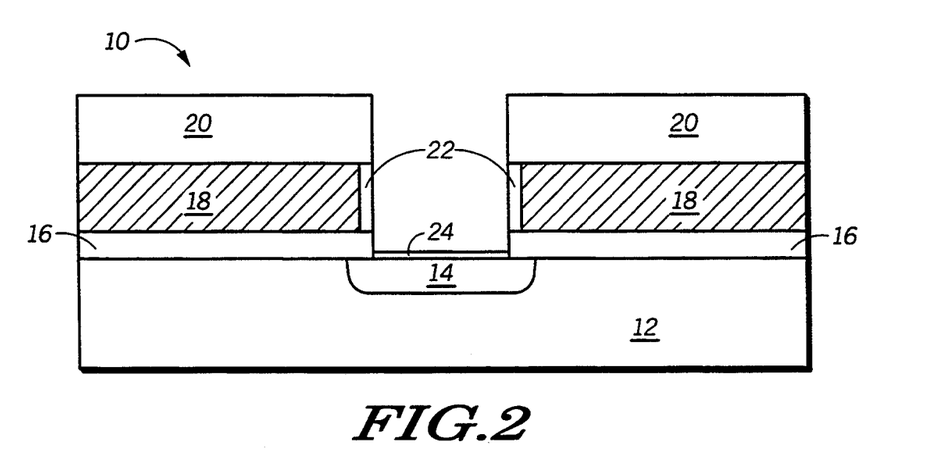

FIG. 2 illustrates a sidewall dielectric layer 22 formation step. A sidewall dielectric layer 22 is formed on a sidewall of the conductive layer 18 that results from the formation of the opening. The dielectric layer 22 is in most cases a grown $SiO_2$ layer. The growth of dielectric layer 22 will result in a thin dielectric layer 24 being grown on the exposed surface of the diffusion 14. In another form, the dielectric layer 22 could be formed via deposition or spacer technology.

Figure 3:
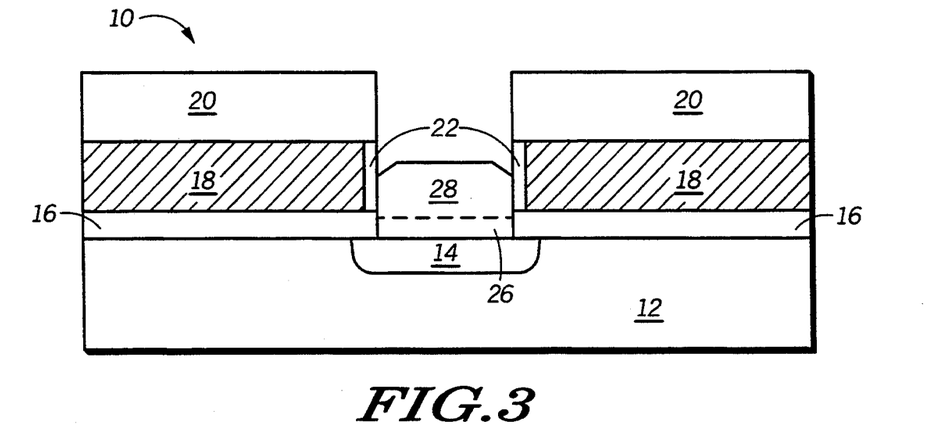

The formation of the dielectric layer 24 is a side-effect that is undesirable. Therefore, FIG. 3 illustrates a dielectric removal step for the dielectric layer 24 along with an epitaxial growth step. A reactive ion etch (RIE) step is used to remove the dielectric layer 24 from the surface of the substrate 12. Due to the fact that the sidewall dielectric layer 22 is formed on a recessed sidewall of the control electrode conductive layer 18, the RIE etch does not remove the sidewall dielectric layer 22. In most cases RIE etching can cause plasma or radiation damage to gate oxides or other critical device layers on an integrated circuit. To protect gate oxides or other critical dielectric layers during RIE etching, the critical layers and/or gate oxides are nitrided via $N_2$, $N_2O$, $NH_3$, or an equivalent. A nitrided oxide resists plasma damage and is a feasible option for transistor 10 or other transistors described herein.

Once the dielectric layer 24 is removed, FIG. 3 illustrates formation of a first current electrode 26 and a control electrode 28. The first current electrode 26 may function either as an emitter or a collector and depends primarily upon desired electrode geometry and doping. The control electrode 28 functions as a base electrode. In a preferred form, a grown conductive region is used to form all of the electrodes of the transistor 10. Preferably, the grown conductive region is formed via epitaxial growth.

The transistor 10 is placed into conventional and commercially available equipment suitable for epitaxial growth. Growth is initiated by heating transistor 10 and exposing exposed portions of the substrate 12 or diffusion 14 to a chemical compound such as dichloro-silane or a similar silicon source gas.

Initially, the first current electrode 26 is formed. Electrode 26 of a first conductivity is formed in the device opening. The first conductivity type is either N type or P type. In order to dope the electrode 26 with dopant atoms of the first conductivity type, in-situ doping is preferred although ion implantation is possible. In-situ doping means that the electrode 26 is doped during growth by a dopant gas source. If the first conductivity type is P type, then a boron-containing gas or a like dopant gas is used to dope electrode 26. If the first conductivity type is N type, then a phosphorus-containing, arsenic-containing, or like dopant gas is used to dope electrode 26. Electrode 26 is grown, with in-situ doping, until the electrode is nearly adjacent a bottom portion of the sidewall dielectric layer 22. Electrode 26 is adjacent the first dielectric layer 16 as illustrated in FIG. 3.

Epitaxial growth continues in a similar manner to form a control electrode 28. The control electrode 28 is formed of a second conductivity type, preferably via in-situ doping as described herein. The second conductivity type is opposite the first conductivity type. The electrode 28 is grown, with in-situ doping, until the electrode 28 is adjacent a bottom portion of the sidewall dielectric layer 22.

Figure 4:
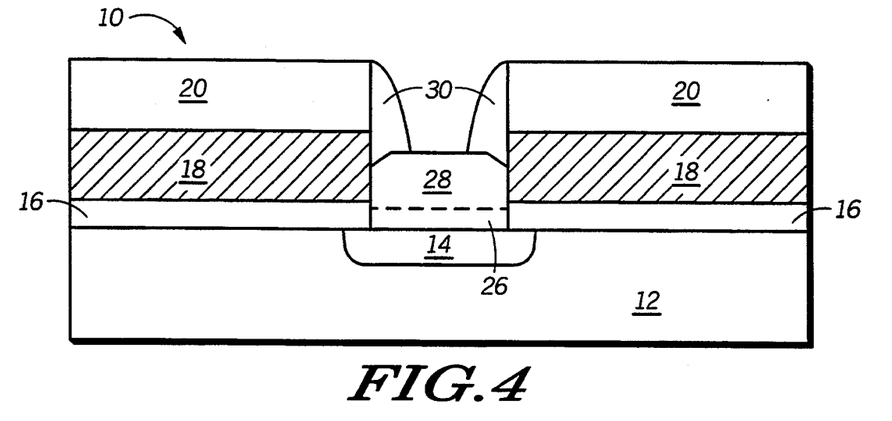

In FIG. 4, the sidewall dielectric layer 22 is removed. Dielectric layer 22 is removed preferably by an isotropic etch step. Once the dielectric layer 22 is removed a brief epitaxial growth step is used to connect the conductive layer 18 to the electrode 28. During epitaxial growth, polysilicon grows polysilicon and single-crystal silicon grows single-crystal silicon. Therefore, the conductive layer 18 and electrode 28 will grow towards each other and connect physically.

After connection of the conductive layer 18 and the electrode 28, a spacer 30 is formed. Spacer 30 serves one primary function. Spacer 30 covers all exposed surfaces of conductive layer 18 to prevent conductive layer 18 from undergoing subsequent polysilicon growth during epitaxial processing steps. Active areas, such as current electrodes, containing or made of polysilicon are usually of poor quality when compared to single-crystalline or epitaxial silicon electrodes. Therefore, spacer 30 ensures that no polysilicon will epitaxially contribute to subsequent epitaxial electrode processing. It should be apparent that the spacer 30 is optional and not always necessary. If the conductive layer 18 is recessed significantly, as described herein, or if the dielectric layer 22 is significantly thick, epitaxial growth of the electrode 28 may connect to and pinch-off conductive layer 18 before the polysilicon of conductive layer 18 can epitaxially grow into the device opening. No spacer 30 is needed if pinch-off occurs.

Figure 5:
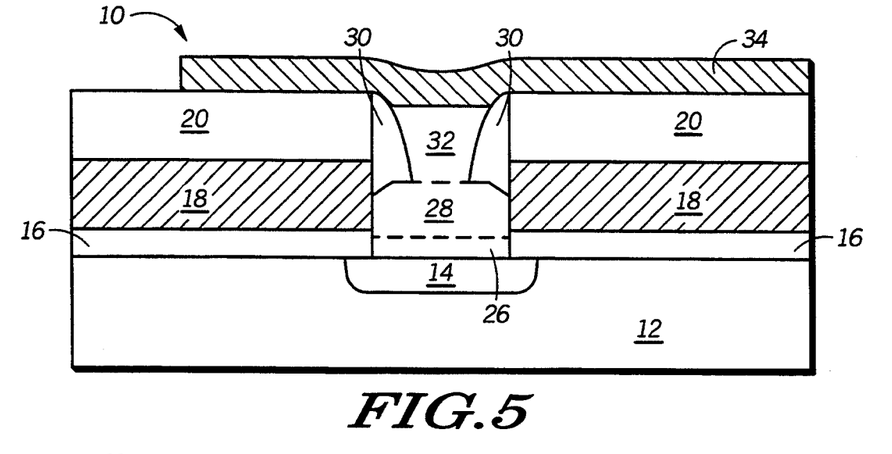

In FIG. 5, epitaxial growth continues to form a second current electrode 32 of the first conductivity type. The electrode 32 functions as either an emitter or a collector depending upon geometry and doping. Electrode 32 always has the opposite functionality of the electrode 26. In most bipolar transistors, collector electrodes are doped less than emitter electrodes and may be physically larger than emitter electrodes. Electrode 32 is grown, with fixed or variable in-situ doping, until the electrode achieves a predetermined thickness or grows out of the device opening. The electrode 32 is laterally adjacent the spacer 30 unless the spacer 30 is not formed. If the spacer 30 is not present, then the electrode 32 is laterally adjacent the dielectric layer 20. Electrode 32 overlies the control electrode 28 as illustrated in FIG. 5. All electrodes mentioned herein are formed within the device opening in a preferred form. A conductive layer 34 makes electrical contact to the electrode 32 and functions as an output conductor for electrode 32.

It is important to note that epitaxial growth requires a clean surface. Therefore, before initiating growth a cleaning cycle, such as a conventional RCA oxidizing clean, an Ishizaka-Shiraki clean, or an equivalent cleaning cycle, is performed.

Figure 6:
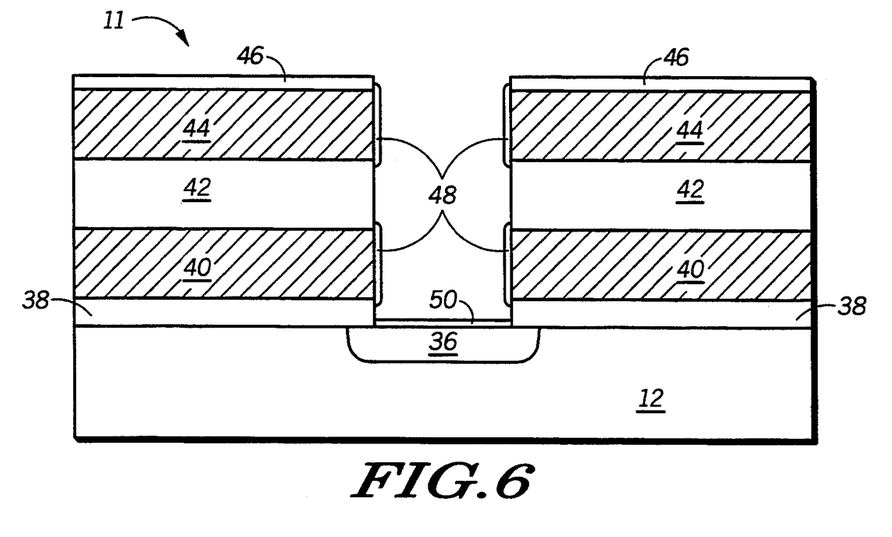
FIGS. 6-9 illustrate, in cross-sectional form, an MOS transistor and method of formation in accordance with the present invention.

In FIG. 6, a structure suitable for the formation of an MOS transistor 11 is illustrated. A substrate 12, a diffusion 36, a dielectric layer 38, a control electrode conductive layer 40, a dielectric layer 42, a sidewall dielectric layer 48, a dielectric layer 50, and a device opening are formed in a manner similar to the transistor 10 of FIGS. 1-2. One difference in FIG. 6 is that a conductive layer 44 and a dielectric layer 46 are formed overlying dielectric layer 42 before the device opening is formed. In addition, FIG. 6 does not illustrate an over-etch step for recessing the conductive layer 40 sidewall. A second method of sidewall dielectric formation using spacers is illustrated for transistor 11. It should be noted that the transistor 10 or transistor 11 can be formed by either the recessed over-etch method described above or the spacer method described herein for transistor 11.

Figure 7:
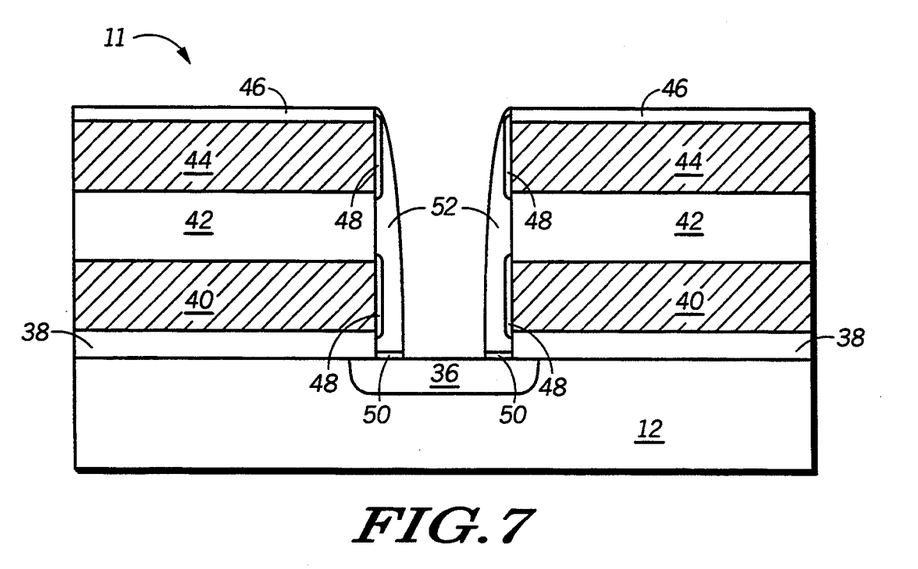

The formation of the dielectric layer 50 is a side-effect that is undesirable. Therefore, FIG. 7 illustrates a dielectric removal step for a portion of the dielectric layer 50. A spacer 52 or like formation is formed overlying the dielectric layer 50 and adjacent the dielectric layer 48. Preferably, the spacer 52 is nitride and forms an inner opening within the device opening. The spacer 52 is used to protect the dielectric layer 48 from oxide etch steps. An oxide etch is then performed selective to nitride and substrate 12. The oxide etch removes a portion of dielectric layer 50 that lies within the inner opening. A portion of the dielectric layer 50 which underlies the spacer and surrounds a periphery of the opening remains unetched. The spacer 52 is removed via conventional nitride or removable spacer techniques. Optionally, the spacer 52 is left on the sidewall and functions as a portion of a sidewall gate dielectric.

Figure 8:
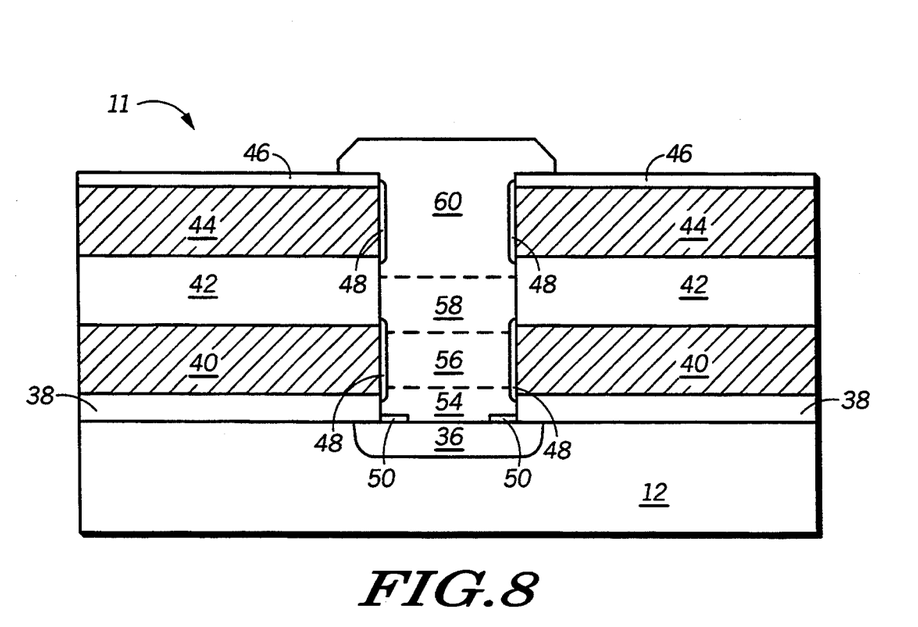

In FIG. 8, first and second current electrodes, also respectively referred to as a drain and a source, and a channel region of transistor 11 are formed. In a preferred form, a grown conductive region is used to form the first and second current electrodes and the channel region. Preferably, the grown conductive region is formed via epitaxial growth as described herein.

Initially, a first current electrode or drain electrode 54 is formed. Drain electrode 54 is formed of a conductivity type that is the same conductivity type as diffusion 36 and opposite a conductivity type of the substrate 12. In-situ doping of electrodes is preferred although implantation is possible. Drain electrode 54 lies within the device opening and laterally adjacent the dielectric layer 38.

Epitaxial growth continues in a similar manner to form a channel region 56. The channel region 56 is formed of the same conductivity type as the substrate, preferably via in-situ doping as described herein. Due to the fact that a portion of the dielectric layer 48 is adjacent the channel region 56, dielectric layer 48 functions as a gate oxide. Therefore, conductive layer 40 functions as a gate electrode. The doping in the channel region 56 can be used to adjust threshold voltages. The channel region 56 is grown with in-situ doping until the channel region 56 is adjacent or nearly adjacent a top portion of the sidewall dielectric layer 48 as illustrated in FIG. 8.

Epitaxial growth continues in order to form a second current electrode, also referred to as a source electrode, with the conductivity type of the first current electrode. The second current electrode has a first sub-region referred to as a lightly doped region 58 and a second sub-region referred to as a heavily doped region 60. The regions 58 and 60 are formed by changing the in-situ doping concentration during growth.

Figure 9:
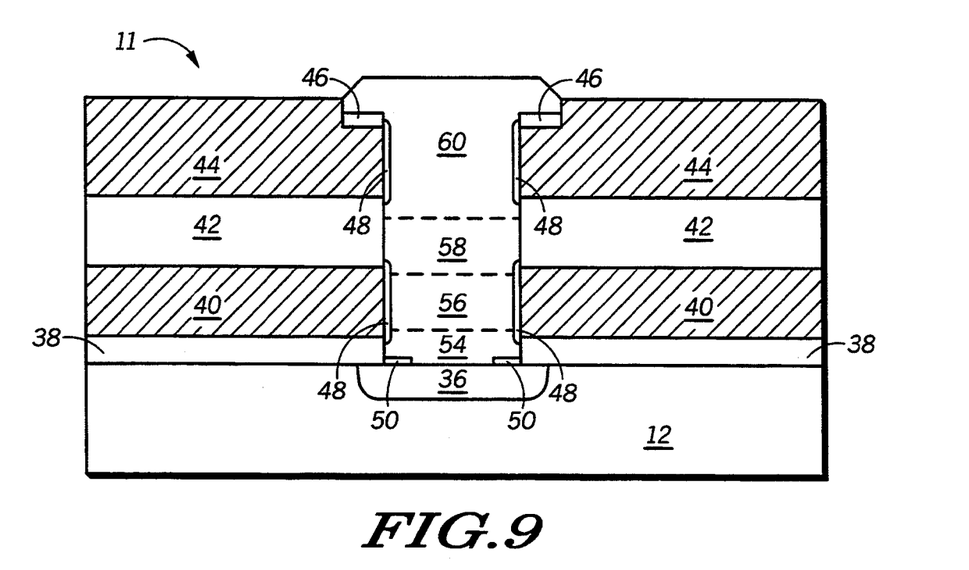

In FIG. 9, portions of the dielectric layer 46 are removed exposing portions of the conductive layer 44. An epitaxial growth step or a deposition step over conductive layer 44 is used to connect the region 60 to the conductive layer 44. Therefore, conductive layer 44 is an output conductor for the second current electrode 60 of transistor 11.

It should be apparent that lightly doped drain (LDD) regions can be formed for one current electrode only, two current electrodes, or no current electrodes, thereby forming respectively a half LDD structure, a full LDD structure, or no LDD regions. In addition, source and drain regions of an MOS transistor are usually interchangeable. Therefore, transistor 11 can be formed wherein a source electrode underlies a drain electrode.

In addition, a thin film transistor (TFT) can be formed by the epitaxial process taught above. If the substrate 12 is polysilicon instead of single crystalline silicon, then polysilicon electrode regions and channel regions are selectively epitaxially grown. This growth forms a vertical TFT that will be similar in structure to the transistor 11 of FIG. 9. A vertical TFT can be helpful in terms of saving area in memory cell designs. It is important to note that both N-channel and P-channel MOS transistors can be formed from transistor 11.

In order to get maximum current carrying capability, a more consistent aspect ratio (transistor width/length ratio), and reliable photolithographic alignment, in most cases the transistor 11 of FIG. 8 will have a conductive layer 40 that completely surrounds the device opening. However, an increased packing density or different functionality can be achieved by only partially surrounding the channel region 56 with conductive layer 40.

The MOS and bipolar transistors described herein may be combined to form portions of logic gates, vertically stacked structures, or isolated stacked transistors with a minimal substrate 12 surface area.

Figure 10:
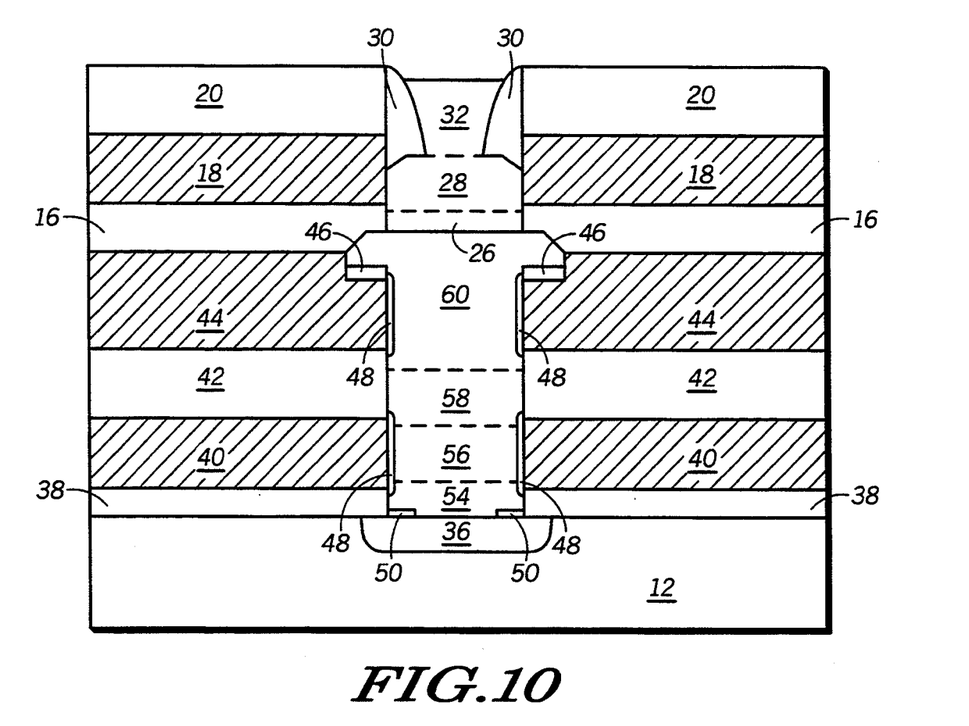
FIG. 10 illustrates, in cross-sectional form, a bipolar and MOS transistor in accordance with the present invention.

In FIG. 10 a structure used in bipolar and metal oxide semiconductor (BiMOS) technology is illustrated. It is important to note that bipolar technology may be combined with P type MOS (PMOS) technology, N-type MOS (NMOS) technology, and complementary MOS (CMOS) technology to achieve various BiMOS structures and circuits. An MOS transistor in accordance with FIGS. 6-9 is formed and has elements which are labeled identically to analogous elements of transistor 11 of FIG. 9. A bipolar transistor has elements which are identically labeled to analogous elements of FIG. 5, is formed in accordance with FIGS. 1-5. The bipolar transistor overlies the MOS transistor. The electrode 26 of the bipolar transistor is connected to a heavily doped region 60 of the MOS transistor. The bipolar transistor uses the region 60 of the MOS transistor as a base layer for epitaxial growth.

In cases where stacked structures result in a PN junction, a salicided region can be formed between the PN junction to electrically short circuit any PN junction voltage drop that may occur. Salicide or silicide regions may be formed via sidewall contacts, or known deposition, patterning, and anneal steps. Many conventional methods of salicidation and silicidation may be used with the transistors and structures presented herein.

Figure 11:
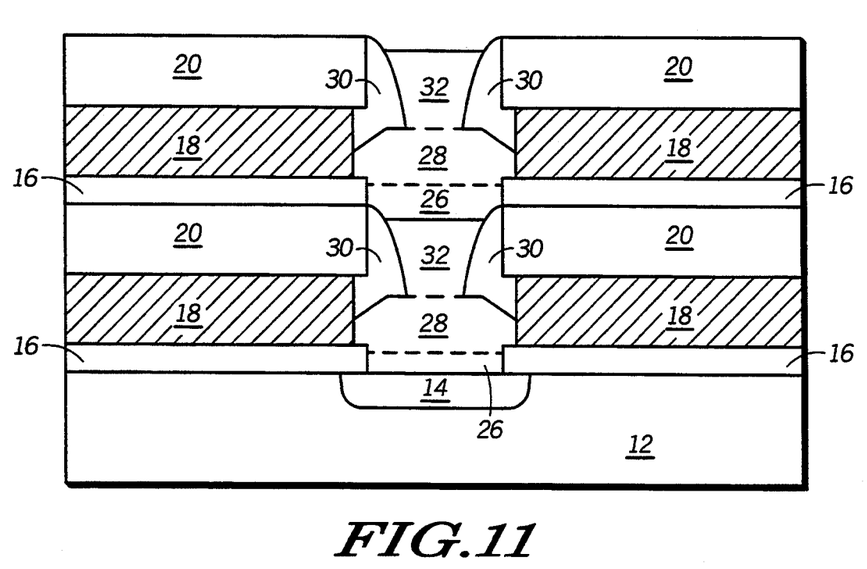
FIG. 11 illustrates, in cross-sectional form, a double bipolar transistor device in accordance with the present invention.

In FIG. 11 a double bipolar transistor structure is formed. A first bipolar transistor is formed in accordance with FIGS. 1-5 and has elements which are identically labeled as in FIG. 5. A second bipolar transistor in accordance with FIGS. 1-5 is formed overlying the first bipolar transistor. The elements of the second bipolar transistor are also identically labeled as in FIG. 5. The electrode 32 of the first bipolar transistor is connected to the electrode 26 of the second bipolar transistor.

Figure 12:
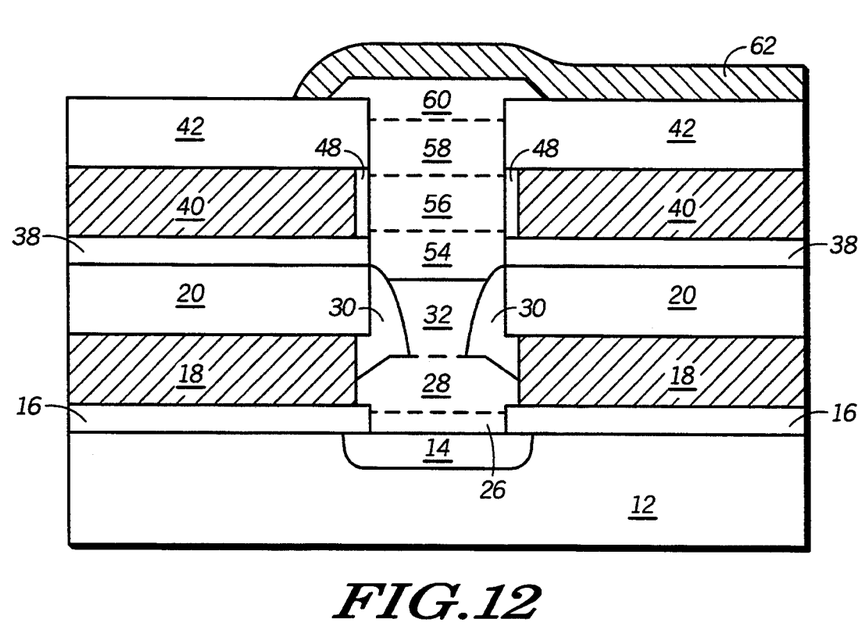
FIG. 12 illustrates, in cross-sectional form, an alternative device having a bipolar transistor and an MOS transistor in accordance with the present invention.

In FIG. 12 a bipolar and MOS transistor structure is formed. A bipolar transistor is formed in accordance with FIGS. 1-5 and has elements which are identically labeled as in FIG. 5. An MOS transistor in accordance with FIGS. 6-9 is formed overlying the bipolar transistor. The MOS transistor is identically labeled to FIG. 9. The MOS transistor illustrates an alternative method to forming a contact to the region 60. Instead of using dielectric layer 46 and conductive layer 44 as in FIG. 9, an overlying conductive layer 62 is formed for an output connection. Therefore, layers 44 and 46 are not formed in FIG. 12. The electrode 32 of the bipolar transistor is connected to the electrode 54 of the MOS transistor.

Figure 13:
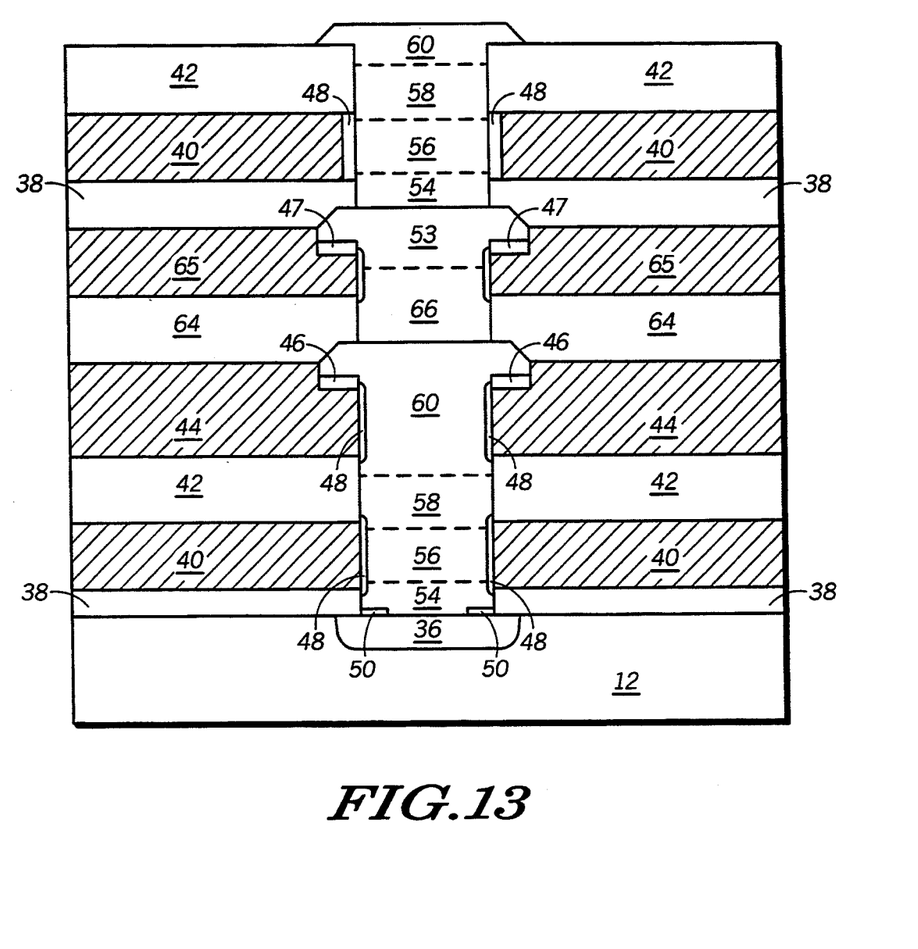
FIG. 13 illustrates, in cross-sectional form, a structure having two electrically isolated MOS transistors in accordance with the present invention.

In FIG. 13 a stacked isolated double MOS structure is illustrated. A first MOS transistor is formed in accordance with FIGS. 6-9 and has elements which are identically labeled as in FIG. 9. An isolation region is formed overlying the first MOS transistor. A MOS second transistor is formed overlying the isolation region in accordance with FIGS. 6-9 and is identically labeled to FIG. 9.

In order to form the isolation region, a dielectric layer 64 is formed overlying the conductive layer 44 of the first MOS transistor. A conductive layer 65 is formed overlying the dielectric layer 64. A dielectric layer 47 is formed overlying the conductive layer 65. An isolation epitaxial region 66 is formed to isolate the first MOS transistor from overlying devices and layers. A doped epitaxial region 53 is formed overlying the isolation epitaxial region 66. An epitaxial connection technique identical to the connection technique illustrated and described in FIG. 9 is used to form a connection between the region 53 and the conductive layer 65. Alternative methods, such as sidewall contacts and the like, are feasible for forming contact to the doped epitaxial region 53 or region 66. In general, the method illustrated in FIG. 4 for the connection of conductive layer 18 to electrode 28 may be used.

A bottom electrode 54 of the second MOS transistor is doped the same conductivity type as the region 53. This doping allows conductive layer 65 to act as a output conductor for the electrode 54 of the second MOS transistor.

If the isolation epitaxial region 66 is connected to an output conductor via the method taught in connection with FIG. 9 or via a conventional deposition or epitaxial sidewall contact, region 66 can be voltage biased to improve isolation between the first and second transistors.

Figure 14:
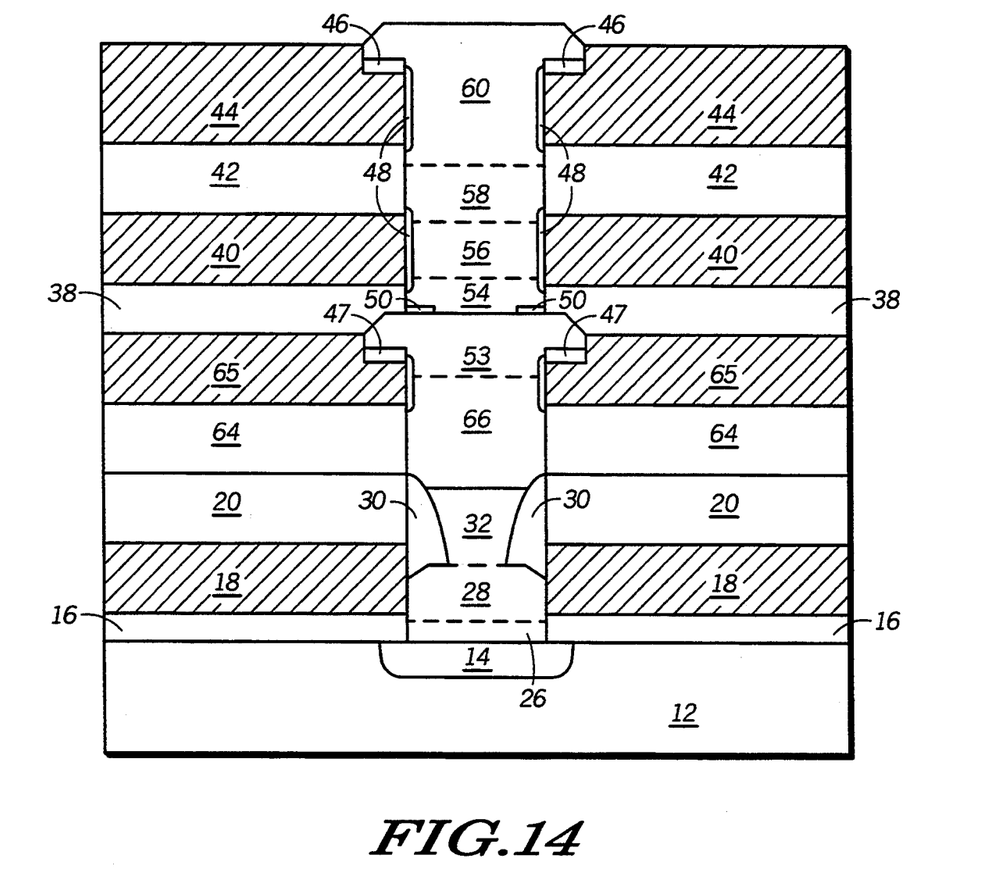
FIG. 14 illustrates, in cross-sectional form, a structure having a bipolar transistor and an MOS transistor which are electrically in accordance with the present invention.

In FIG. 14 a stacked bipolar transistor and an MOS transistor which are electrically isolated are illustrated. A bipolar transistor is formed in accordance with FIGS. 1-5 and has elements which are identically labeled to analogous elements of FIG. 5. An isolation region in accordance with FIG. 13 is formed overlying the bipolar transistor. An MOS transistor is formed overlying the isolation region in accordance with FIGS. 6-9 and has elements which are identically labeled to analogous elements of FIG. 9. Biasing the region 66 as discussed above will improve isolation between the MOS transistor and the bipolar transistor.

Figure 15:
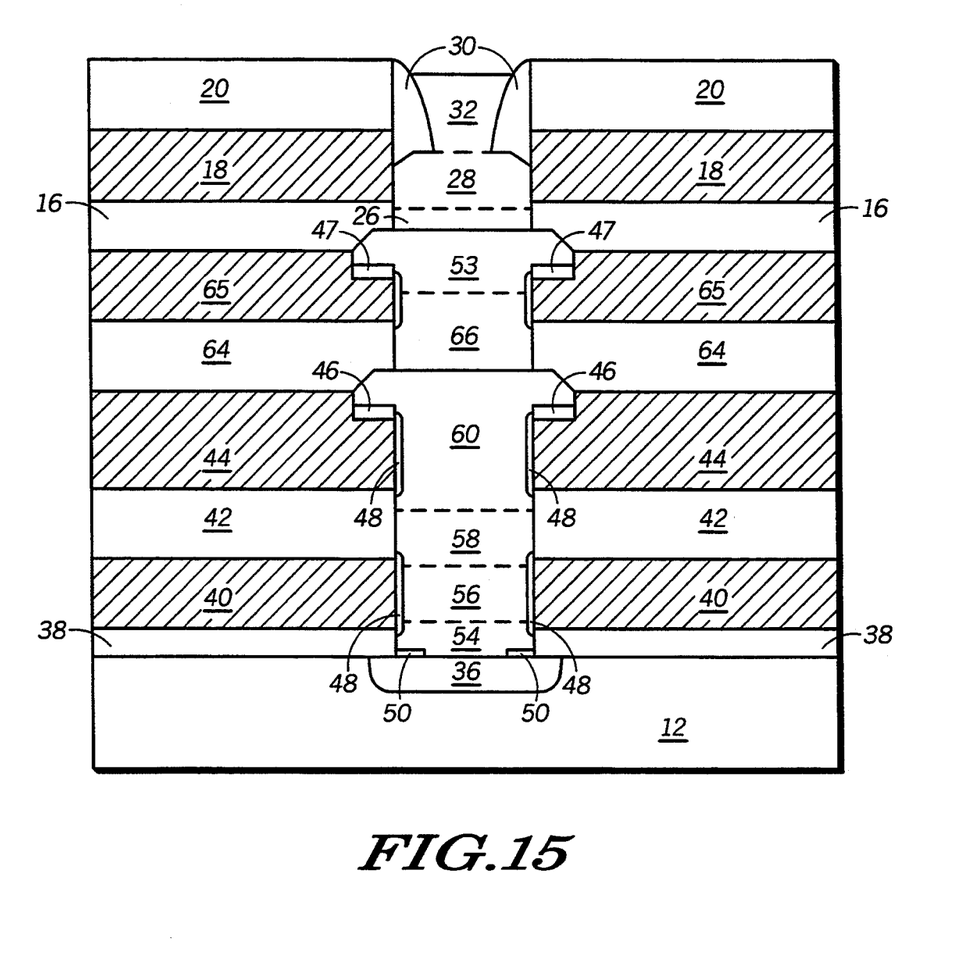
FIG. 15 illustrates, in cross-sectional form, another structure having a bipolar transistor and an MOS transistor which are electrically isolated in accordance with the present invention.

In FIG. 15 a stacked MOS transistor and a bipolar transistor which are electrically isolated are illustrated. Initially, an MOS transistor is formed in accordance with FIGS. 6-9 and has elements which are identically labeled to analogous elements of FIG. 9. An isolation region in accordance with FIG. 13 is formed overlying the MOS transistor. An bipolar transistor is formed overlying the isolation region in accordance with FIGS. 1-5 and has elements which are identically labeled with analogous elements of FIG. 5. The bottom electrode 26 of the bipolar transistor is doped the same conductivity type as the region 53. This doping allows conductive layer 65 to act as a output conductor for the electrode 26 of the bipolar transistor. In addition, biasing the region 66 as discussed above will improve isolation between the MOS transistor and the bipolar transistor.

Figure 16:
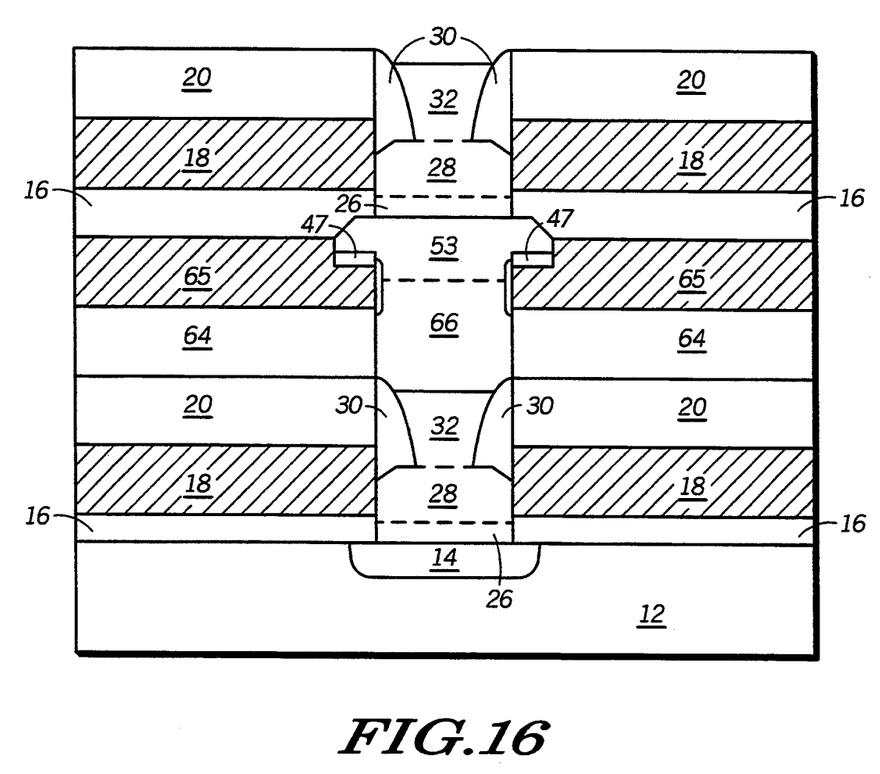
FIG. 16 illustrates, in cross-sectional form, yet another structure having two bipolar transistors which are electrically isolated in accordance with the present invention.

In FIG. 16 a stacked, isolated, dual bipolar transistor structure is illustrated. A first bipolar transistor is formed in accordance with FIGS. 1-5 and has elements which are identically labeled with analogous elements of FIG. 5. An isolation region in accordance with FIG. 13 is formed overlying the first bipolar transistor. An second bipolar transistor is formed overlying the isolation region in accordance with FIGS. 1-5 and has elements which are identically labeled with analogous elements of FIG. 5. Biasing the region 66 as discussed above will improve isolation between the bipolar transistors.

The inventive method and devices presented herein provide vertical MOS and bipolar transistor fabrication. BiMOS logic gate structures or stacked isolation schemes that have reduced surface area, reduced leakage currents, which reduce or avoid short channel effects, and which reduce channel length variation are taught. Due to the fact that a channel length of the transistor 11 or base length of the transistor 10 are controlled by a conductive layer 40 or 18 deposition thickness, many transistor gate, base, and channel geometries will be independent from lithography, smaller than lithography allows, and controlled within a smaller variation. The effective channel width of the transistor 11 is larger than planar transistors of the same surface area due to the fact that the channel width of a cylindrical transistor is the cylinder's circumference. Due to the smaller channel length and the greater channel width, or the smaller base area, current carrying capability of the inventive transistor increases without increasing transistor surface area. In many cases, transistor substrate surface area and integrated circuit surface area will be reduced.

The transistors 10 and 11 are formed within a contact which is lithographically the smallest feature size in an integrated circuit. In addition, the formation of the inventive transistor requires few photolithography steps, and many features of the transistors 10 and 11 can be self-aligned. Asymmetric source and drain electrodes result for transistor 11, and LDD and half LDD transistors are easily formed. Bulk inversion of the channel region of transistor 11 can be achieved for small channel region circumferences. The inventive transistor has low off current, and leakage to the substrate is minimized due to the fact that many diffusions are placed in series and isolated from the substrate.

Doping of region 56 or the geometry of the region 56 of transistor 11 may either be a fully depleted channel region or bulk inverted channel region. In some cases, transistor 11 may be formed in an opening that is too large to achieve full bulk inversion. Bulk inversion means that when transistor 11 is "on" or is conducting current, the inverted channel region extends completely across region 56 increasing the mobile charge concentration. Mobile charge carries are either electrons or holes. Full channel depletion or bulk inversion is desirable for improved performance. If a sidewall contact is made to the transistor 11 channel region and the sidewall contact is connected to the substrate or a power supply, depending on device conductivity type, a greater level of depletion can be achieved. This connection is possible for a transistor designed as in FIG. 9, wherein a partially surrounding gate electrode transistor is formed.

Furthermore, transistors 10 and 11 allow for vertical BiCMOS and BiMOS circuit fabrication with many of the advantages listed above and reduced substrate surface area.

While the present invention has been illustrated and described with reference to specific embodiments, further modifications and improvements will occur to those skilled in the art. For example, epitaxial growth methods vary in temperature, doping mechanisms, length of time, procedures, and chemistry, and most of these epitaxial processes are capable of forming the electrodes and regions of the inventive transistors and devices. Many applications exist for the inventive transistors and inventive structures. Many cleaning cycles exist for epitaxial growth procedures. Sidewall dielectrics can be formed in one of several ways and may even be used as sidewall gate dielectrics. Although two sidewall dielectric formation alternatives are presented herein, others may be used. Both N-channel MOS, P-channel MOS, NPN bipolar, and PNP bipolar transistors can be manufactured with the inventive process. Several methods may be used for forming output conductor connections to electrodes. In some cases the sidewall dielectric layer described herein may be a spacer or like structure. It is to be understood, therefore, that this invention is not limited to the particular forms illustrated and that it is intended in the appended claims to cover all modifications that do not depart from the spirit and scope of this invention.

We claim:

1. A method of forming a transistor useful for further vertical integration comprising the steps of:
   providing a base layer having a surface;
   forming a first dielectric layer overlying the base layer;

forming a control electrode conductive layer overlying the first dielectric layer;

forming a second dielectric layer overlying the control electrode conductive layer;

removing portions of each of the first dielectric layer, the control electrode conductive layer, and the second dielectric layer, to form a device opening which exposes the base layer and forms a sidewall of the control electrode conductive layer;

forming a sidewall dielectric layer laterally adjacent the sidewall of the control electrode conductive layer;

forming a first current electrode of a first conductivity type within the device opening, the first current electrode being laterally adjacent the first dielectric layer, and overlying the base layer;

forming a control electrode of a second conductivity type within the device opening, the control electrode being laterally adjacent a bottom portion of the sidewall dielectric layer, and overlying the first current electrode;

removing the sidewall dielectric layer;

electrically connecting the control electrode conductive layer to the control electrode; and forming a second current electrode of the first conductivity type within the device opening and overlying the control electrode conductive layer.

2. The method of claim 1 wherein the step of forming a second current electrode further comprises the step of:

forming a sidewall spacer laterally adjacent the control electrode conductive layer before forming the second current electrode.

3. The method of claim 1 wherein the steps of forming the first current electrode, the control electrode and the second current electrode further comprises the step of:

forming the first current electrode, the control electrode, and the second current electrode as epitaxial regions.

4. The method of claim 1 wherein the steps of forming the first current electrode, the control electrode and the second current electrode further comprises the step of:

using in-situ doping to dope the first current electrode, the control electrode, and the second current electrode with dopant atoms to obtain said first and second conductivity types.

5. The method of claim 1 wherein the step of removing portions further comprises the step of:

using a non-selective etch to remove portions of the second dielectric layer and the control electrode conductive layer.

6. The method of claim 1 wherein the step of forming the sidewall dielectric further comprises the step of:

etching the sidewall of the control electrode conductive layer to laterally recess the sidewall of the control electrode conductive layer before forming the sidewall dielectric.

7. The method of claim 1 wherein the step of removing portions further comprises the steps of:

forming a masking layer overlying the second dielectric layer, the masking layer having a mask opening;

etching a portion of the second dielectric layer exposed by the mask opening to form a portion of the device opening in the second dielectric layer which is self-aligned to the mask opening and exposing a portion of the control electrode conductive layer;

etching the exposed portion of the control electrode conductive layer to form a portion of the device opening in the control electrode conductive layer which is self-aligned to the portion of the device opening in the second dielectric layer and exposes a portion of the first dielectric layer; and etching the exposed portion of the first dielectric layer to form a portion of the device opening in the first dielectric layer which is self-aligned to the portion of the device opening in the control electrode conductive layer and exposes the surface of the substrate.

8. The method of claim 1 further comprising a step of forming a diffusion region of the first conductivity type within the base layer and exposed at the surface of the base layer, the diffusion region being self-aligned to said device opening.

9. The method of claim 1 further comprising the steps of:

forming a diffusion region of the first conductivity type in the base layer and being exposed at the surface of the base layer, the diffusion region being formed prior to the step of forming the control electrode conductive layer, said device opening overlying the diffusion region.

10. The method of claim 1 wherein the step of connecting the control electrode conductive layer to the control electrode further comprises connecting the control electrode conductive layer to the control electrode by using an epitaxial growth step.

11. A method of forming a first transistor and a second transistor comprising the steps of:

forming the first transistor with a first current electrode that underlies a second current electrode thereof, the first transistor being a transistor selected from a group consisting of: an MOS transistor and a bipolar transistor; and forming the second transistor overlying the first transistor, the second transistor having a first current electrode that underlies a second current electrode thereof, the second transistor being a transistor selected from a group of: an MOS transistor and a bipolar transistor, wherein at least one of either the first transistor or the second transistor is a bipolar transistor.

12. The method of claim 11 further comprising the steps of:

forming an isolation region overlying the second current electrode of the first transistor, the isolation region separating the first and second transistors; and forming the first transistor and the second transistor as MOS transistors wherein the first current electrode and second current electrode of the first transistor are respectively either a source electrode and a drain electrode or a drain electrode and a source electrode, and the first current electrode and second current electrode of the second transistor are respectively either a source electrode and a drain electrode or a drain electrode and a source electrode.

13. The method of claim 11 further comprising the steps of:

forming an isolation region overlying the second current electrode of the first transistor, the isolation region separating the first and second transistors; and forming the first transistor as an MOS transistor and the second transistor as a bipolar transistor, the first current electrode and second current electrode of the first transistor are respectively either a source electrode and a drain electrode or a drain electrode and a source electrode, and the first current electrode and second current electrode of the second transistor are respectively either an emitter electrode and a collector electrode or a collector electrode and an emitter electrode.

14. The method of claim 11 further comprising the steps of:

forming an isolation region overlying the second current electrode of the first transistor, the isolation region separating the first and second transistors; and forming the first transistor as a bipolar transistor and the second transistor as an MOS transistor, the first current electrode and second current electrode of the first transistor are respectively either an emitter electrode and a collector electrode or a collector electrode and an emitter electrode, and the first current electrode and second current electrode of the second transistor are respectively either a source electrode and a drain electrode or a drain electrode and a source electrode.

15. The method of claim 11 further comprising the steps of:

forming an isolation region overlying the second current electrode of the first transistor, the isolation region separating the first and second transistors; and forming the first transistor and second transistor as bipolar transistors wherein the first current electrode and second current electrode of the first transistor are respectively either an emitter electrode and a collector electrode or a collector electrode and an emitter electrode, and the first current electrode and second current electrode of the second transistor are respectively either an emitter electrode and a collector electrode or a collector electrode and an emitter electrode.

16. The method of claim 11 further comprising the step of:

forming the first transistor as an MOS transistor and the second transistor as a bipolar transistor, the first current electrode and second current electrode of the first transistor are respectively either a source electrode and a drain electrode or a drain electrode and a source electrode, and the first current electrode and second current electrode of the second transistor are respectively either an emitter electrode and a collector electrode or a collector electrode and an emitter electrode, the first current electrode of the second transistor being physically connected to the second current electrode of the first transistor.

17. The method of claim 11 further comprising the steps of:

forming the first transistor as a bipolar transistor and the second transistor as an MOS transistor, the first current electrode and second current electrode of the first transistor are respectively either an emitter electrode and a collector electrode or a collector electrode and an emitter electrode, and the first current electrode and second current electrode of the second transistor are respectively either a source electrode and a drain electrode or a drain electrode and a source electrode, the first current electrode of the second transistor being physically connected to the second current electrode of the first transistor.

18. The method of claim 11 further comprising the steps of:

forming the first transistor and second transistor as bipolar transistors wherein the first current electrode and second current electrode of the first transistor are respectively either an emitter electrode and a collector electrode or a collector electrode and an emitter electrode, and the first current electrode and second current electrode of the second transistor are respectively either an emitter electrode and a collector electrode or a collector electrode and an emitter electrode, the first current electrode of the second transistor being physically connected to the second current electrode of the first transistor.

19. A method of forming a first transistor and a second transistor comprising the steps of:

forming the first transistor with a first current electrode that underlies a second current electrode thereof, the first transistor being a transistor selected from a group consisting of: an MOS transistor and a bipolar transistor;

forming an isolation region which overlies the first transistor; and forming the second transistor overlying the isolation region, the second transistor having a first current electrode that underlies a second current electrode thereof, the second transistor being a transistor selected from a group consisting of: an MOS transistor and a bipolar transistor wherein the isolation region isolates the first transistor from the second transistor.

20. The method of claim 19 wherein the step of forming the isolation region comprises:

forming the isolation region as an epitaxial region of material.

21. The method of claim 19 wherein the step of forming the isolation region comprises:

forming an output conductor which is connected to the isolation region; and biasing the isolation region to a selected voltage through the output conductor to improve isolation between the first transistor and the second transistor.

22. A method of forming a first transistor and a second transistor comprising the steps of:

forming the first transistor with a first current electrode that underlies a second current electrode thereof, the first transistor being a transistor selected from a group consisting of: an MOS transistor and a bipolar transistor;

forming an isolation region which overlies the first transistor; and forming the second transistor overlying the isolation region, the second transistor having a first current electrode that underlies a second current electrode thereof, the second transistor being a transistor selected from a group consisting of: an MOS transistor and a bipolar transistor wherein the isolation region isolates the first transistor from the second transistor and at least one of either the first or second transistors is a bipolar transistor.

23. A method for forming a transistor structure comprising the steps of:
- forming a bipolar transistor having a first current electrode overlying a second current electrode and a base electrode separating the first and second current electrodes; and
- forming a metal oxide semiconductor (MOS) transistor overlying the bipolar transistor and having a source region and a drain region separated by a channel region wherein a gate electrode is adjacent the channel region and controls a conductivity of the channel region.

24. The method of claim 23 wherein the first current electrode of the bipolar transistor is formed as an emitter electrode and the second current electrode of the bipolar transistor is formed as a collector electrode.

25. The method of claim 23 wherein an isolation region is formed between the bipolar transistor and the metal oxide semiconductor (MOS) transistor.

26. A method for forming a transistor structure comprising the steps of:
- forming a metal oxide semiconductor (MOS) transistor having a first current electrode overlying a second current electrode wherein the first current electrode is separated from the second current electrode by a channel region and a gate electrode is adjacent the channel region for controlling current flow through the channel region; and
- forming a bipolar transistor overlying the metal oxide semiconductor (MOS) transistor, the bipolar transistor having an emitter electrode separated from a collector electrode by a base electrode.

27. The method of claim 23 wherein an isolation region is formed between the bipolar transistor and the metal oxide semiconductor (MOS) transistor.

28. A method for forming a transistor structure comprising the steps of:
- forming a first bipolar transistor having a first current electrode overlying a second current electrode and a base electrode separating the first and second current electrodes of the first bipolar transistor; and
- forming a second bipolar transistor overlying the first bipolar transistor, the second bipolar transistor having an emitter electrode separated from a collector electrode by a base electrode.

29. The method of claim 28 wherein an isolation region is formed between the first and second bipolar transistors.

* * * * *